(12) United States Patent
Chiu

(10) Patent No.: US 6,890,217 B2
(45) Date of Patent: May 10, 2005

(54) INTEGRATED SOCKET FOR MICROPROCESSOR PACKAGE AND CACHE MEMORY

(75) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 94 days.

(21) Appl. No.: 10/637,375

(22) Filed: Aug. 8, 2003

(65) Prior Publication Data

US 2004/0029414 A1 Feb. 12, 2004

Related U.S. Application Data

(63) Continuation of application No. 10/080,867, filed on Feb. 21, 2002, now Pat. No. 6,626,681.

(51) Int. Cl.[7] .................................................. H01R 9/09
(52) U.S. Cl. ........................................ 439/630; 439/631
(58) Field of Search .......................... 439/660, 62, 676, 439/946, 354, 59–60

(56) References Cited

U.S. PATENT DOCUMENTS

| | | | | |
|---|---|---|---|---|
| 2,701,346 A | 2/1955 | Powell | | |
| 3,591,834 A | * 7/1971 | Kolias | ......................... | 361/791 |
| 5,303,121 A | 4/1994 | Thornberg | | |
| 5,859,538 A | 1/1999 | Self | | |
| 6,134,701 A | * 10/2000 | Chen et al. | ..................... | 716/8 |
| 6,147,871 A | 11/2000 | DeWitt et al. | | |
| 6,203,365 B1 | 3/2001 | Wu | | |
| 6,261,104 B1 | * 7/2001 | Leman | ........................ | 439/61 |
| 6,328,605 B1 | 12/2001 | Walker et al. | | |
| 6,347,039 B1 | * 2/2002 | Lee | ............................ | 361/760 |
| 6,394,850 B1 | * 5/2002 | Oliphant et al. | ............ | 439/660 |

FOREIGN PATENT DOCUMENTS

JP            1229209          9/1989

\* cited by examiner

*Primary Examiner*—J. F. Duverne
(74) *Attorney, Agent, or Firm*—Blakely, Sokoloff, Taylor & Zafman LLP

(57) ABSTRACT

A socket comprises a socket body having a bottom surface at which the socket can be mounted to a motherboard, a top surface, and several side surfaces. The top surface has an array of electrical contacts at which a package containing a microprocessor can be coupled to the socket. One or more of the side surfaces have a slot, which includes an electrical interface at which a circuit card containing cache memory for use by the microprocessor can be removably inserted into the socket body parallel to the motherboard.

17 Claims, 4 Drawing Sheets

INTEGRATED SOCKET FOR MICROPROCESSOR PACKAGE AND CACHE MEMORY

This is a continuation of U.S. patent application Ser. No. 10/080,867 filed on Feb. 21, 2002, now U.S. Pat. No. 6,626,681, which is incorporated herein by reference.

FIELD OF THE INVENTION

The present invention pertains to sockets used to connect microelectronic device packages to circuit boards. More particularly, the present invention relates to a socket which accommodates both a microprocessor package and cache memory.

BACKGROUND OF THE INVENTION

Modern computer systems include at least one microprocessor or other similar controlling device, and memory, commonly including several levels of cache memory. One type of cache memory is located on the same die as the microprocessor and is referred to as Level 1 or "L1" cache. Typically, the L1 cache includes a very small amount of memory but can be accessed very quickly by the microprocessor due to its proximity to the microprocessor. Another type of cache, known as Level 2 or "L2" cache, is normally mounted in the same package as the microprocessor but on a different die. L2 cache typically includes more memory than the L1 cache but cannot be accessed as quickly. A third level of cache, known as Level 3 or "L3" cache, is normally mounted on a separate circuit board or circuit card from the microprocessor package and typically includes more memory than the L1 and L2 caches. However, the L3 cache cannot be accessed as quickly as the L1 and L2 caches, due to its greater distance from the microprocessor.

FIG. 1 shows an example of an L3 cache card design. An L3 cache die can be assembled in a wire-bond or flip-chip type of package, and the package can be surface-mounted on a printed circuit board (PCB) card. Alternatively, the L3-cache die can be directly mounted on a PCB card with or without encapsulate. Hence, the illustrated design includes a PCB card 1, on which one or more cache memory dies (or packages containing such dies) 2 are mounted, and edge fingers 3 to allow the PCB card to be inserted into an edge connector on a motherboard.

FIG. 2 shows how the L3 cache card of FIG. 1 can be installed in a computer system. The L3 cache card 1 can be inserted into an edge connector 21 that is mounted on the motherboard 22, a shown. Also mounted on the motherboard 22 is a socket 23, which allows the microprocessor package 24 to be coupled to the motherboard 22. A heat sink 25 is thermally coupled to the microprocessor package through a package heat spreader 26.

The design of FIGS. 1 and 2 has several disadvantages. First, the distance between the microprocessor package and the L3 cache is undesirably large, which increases the L3 cache access time. The L3 cache card also consumes additional space and requires edge connectors on the motherboard. Further, the L3 cache card tends to block some of the airflow through the heat sink, hindering the cooling of other components, such as microprocessor, chipset, and voltage regulators.

An alternative approach is to mount the L3 cache on the same microprocessor package, like a multi-chip module (MCM). However, the cost of such an approach is very high and manufacturing is difficult.

BRIEF DESCRIPTION OF THE DRAWINGS

The present invention is illustrated by way of example and not limitation in the elements and in which.

DETAILED DESCRIPTION

A socket which accommodates both a microprocessor package and cache memory is described. Note that in this description, references to "one embodiment" or "an embodiment" mean that the feature being referred to is included in at least one embodiment of the present invention. Further, separate references to "one embodiment" in this description do not necessarily refer to the same embodiment; however, neither are such embodiments mutually exclusive, unless so stated and except as will be readily apparent to those skilled in the art. For example, a feature, structure, act, etc. described in one embodiment may also be included in other embodiments. Thus, the present invention can include a variety of combinations and/or integrations of the embodiments described herein.

As described in greater detail below, in one embodiment of the invention, the socket comprises a socket body having a bottom surface at which the socket can be mounted to a motherboard, a top surface to accommodate a microprocessor package, and several side surfaces. One or more of the side surfaces have a slot that includes an electrical interface at which a circuit card containing cache memory for use by the microprocessor can be removably inserted into the socket body parallel to the motherboard.

As will be apparent from this description, this socket design provides a significant reduction in the distance between a microprocessor package and L3 cache (or other device), thereby allowing faster access by the microprocessor to the L3 cache. This design also improves air flow through the microprocessor's heat sink, allowing for more efficient cooling of the microprocessor and related components. Further, eliminating the traditional L3 cache edge connectors allows the motherboard size to be design also allows L3 cache cards to be upgraded easily. Moreover, with this design the L3 cache card can share the same thermal solutions (heat sink, etc.) as the microprocessor package, if desired. There is also no need to modify the current microprocessor package design.

Figure 1:
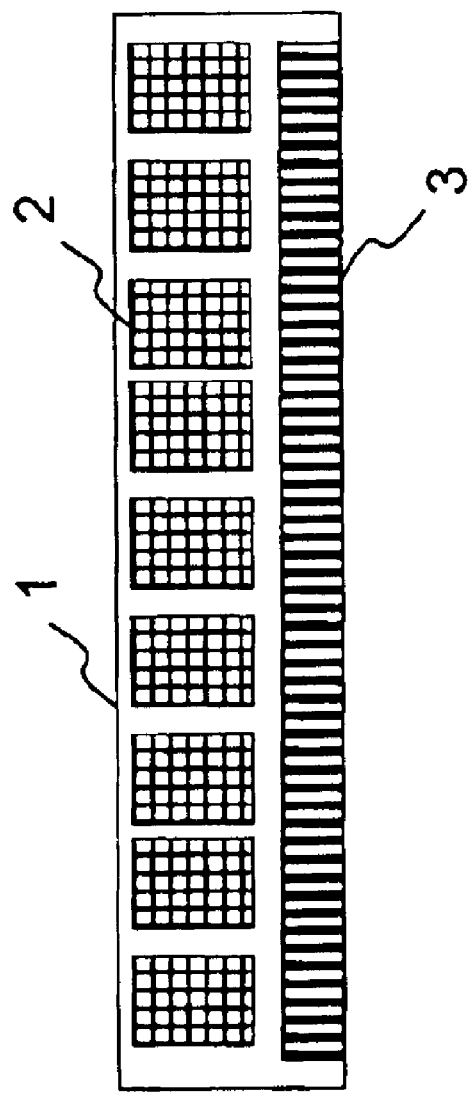
FIG. 1 shows an L3 cache card.
Figure 2:
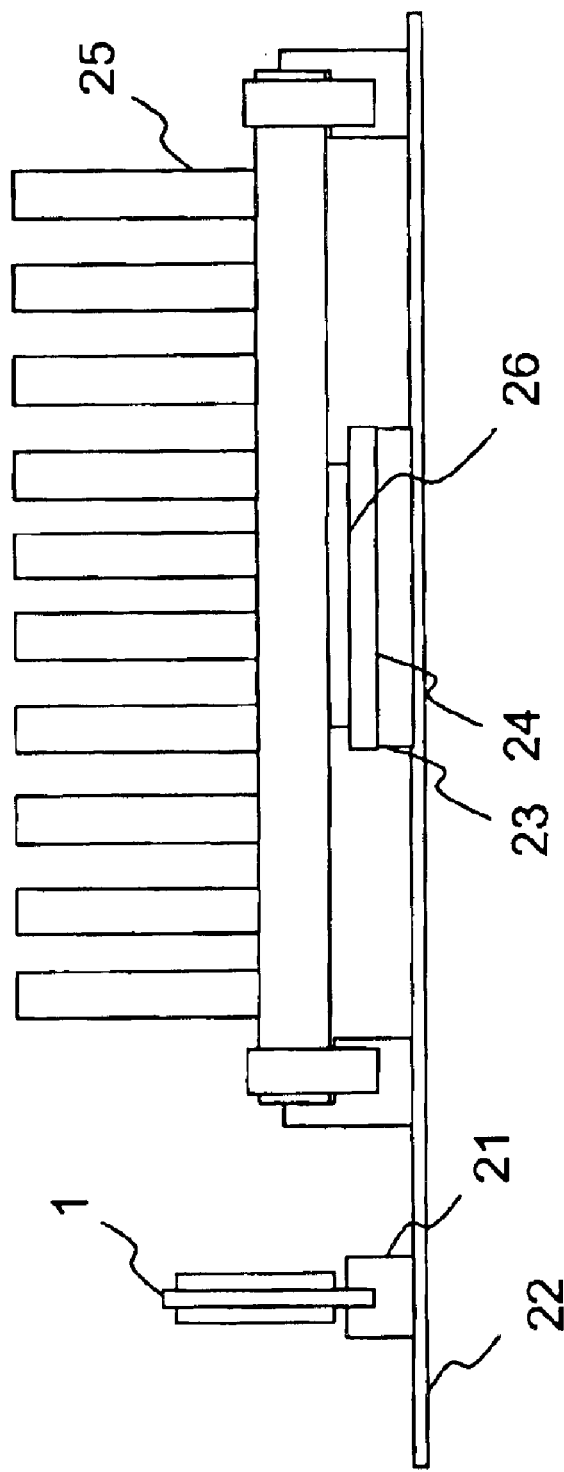
FIG. 2 shows the installation of an L3 cache card and a microprocessor on a motherboard.
Figure 3:
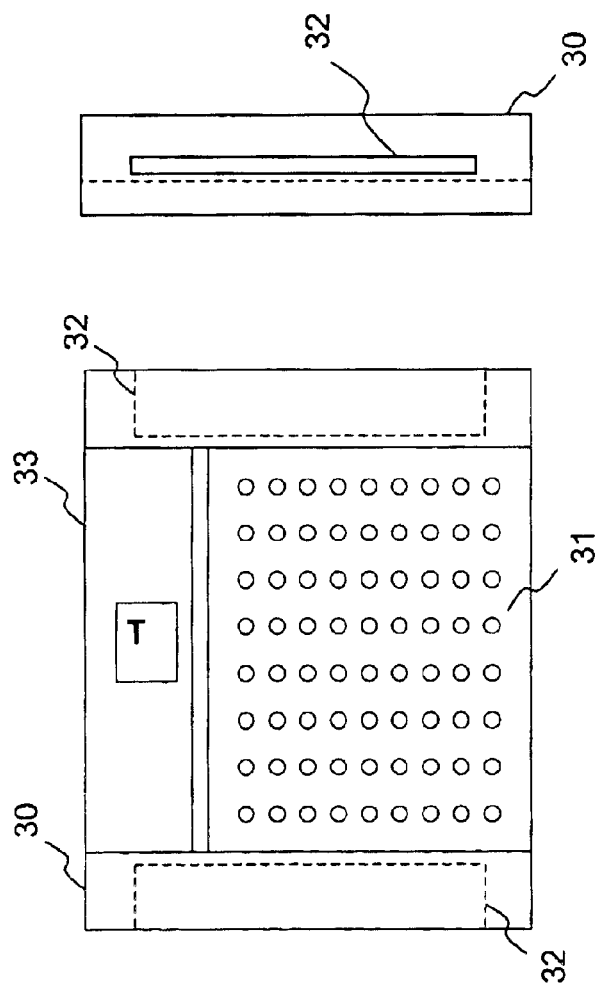
FIG. 3 shows three orthogonal view of a socket according to one embodiment of the invention.

FIG. 3 shows three orthogonal views (top, front and side) of a socket according to one embodiment of the invention. A microprocessor package can be mounted to the socket of the present invention in the same way as with the traditional microprocessor socket 23 (FIG. 2). That is, a pin grid array (PGA) or ball grid array (BGA) of the package can be mounted to a corresponding array 31 of electrical contacts on the top surface of the socket body (hereinafter "socket") 30. In addition, with this design, L3 cache cards can be plugged into slots 32 in two sides of the socket 30. It will be recognized that the size of the L3 cache card needs to be made to match the slots 32 in the socket 30. A socket handle 33 facilitates physical handling of the socket 30.

Note that while the socket 30 is shown to have two slots 32, in other embodiments the socket 30 may have only one slot 32 or more than two slots 32. Furthermore, a socket embodying the present invention may alternatively have a different shape than that illustrated in FIG. 3.

Figure 4:
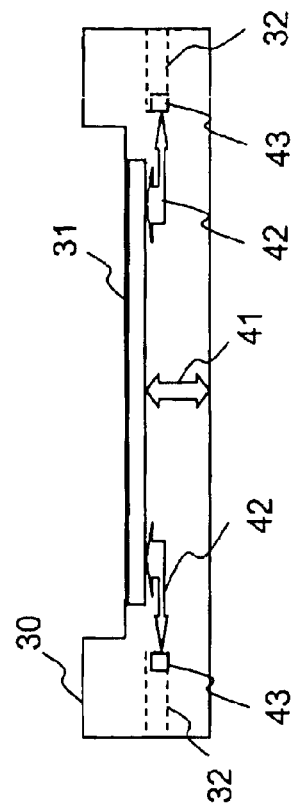
FIG. 4 schematically shows the electrical connections within the socket of FIG. 3.

FIG. 4 schematically shows the electrical connections within the socket 30. The socket 30 includes electrical connections 41 between the array 31 on the top surface and the electrical connection to the motherboard at the bottom surface of the socket. The socket 30 also provides electrical connections 42 between the array 31 and an electrical interface 43 in each of the slots 32, to allow communication between the microprocessor and the L3 cache.

Figure 5:
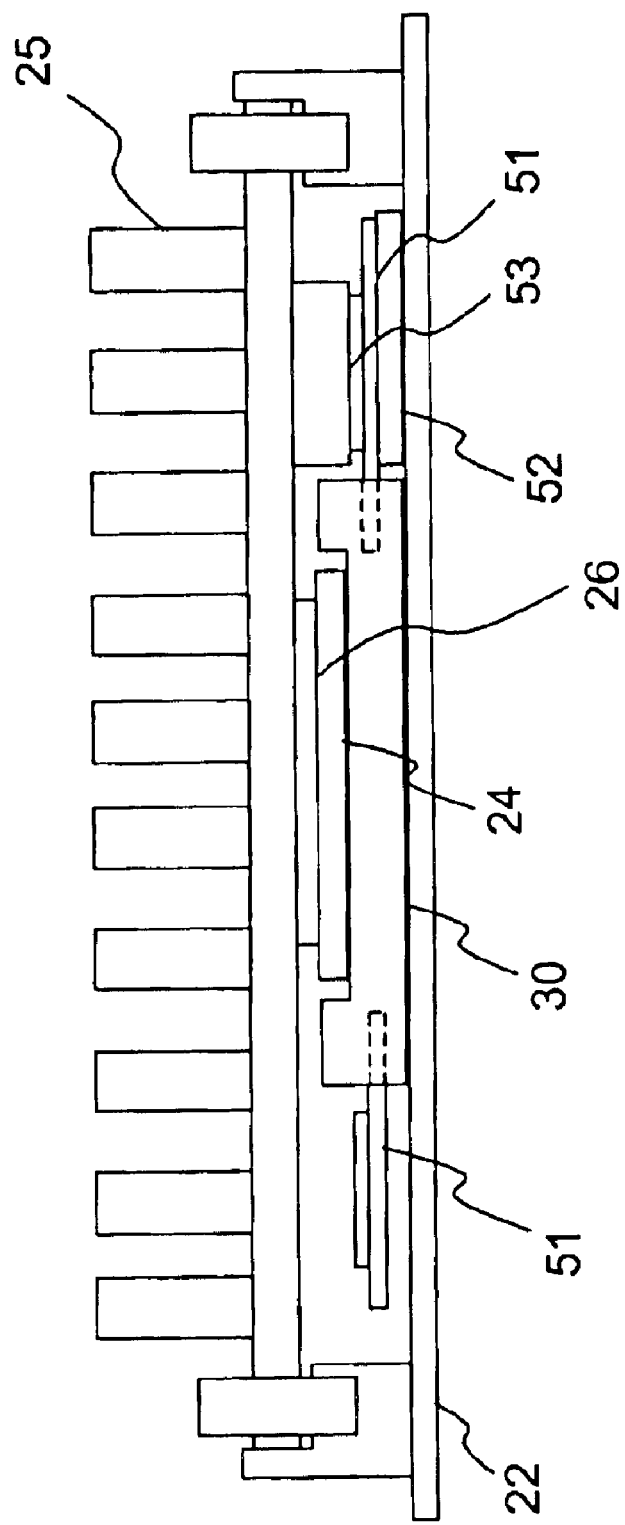
FIG. 5 shows the installation of L3 cache cards and a microprocessor on a motherboard using a socket in accordance with the invention.

FIG. 5 shows an example of the installation of L3 cache cards and a microprocessor on a motherboard using a socket in accordance with the present invention. When inserted into the socket 30, each L3 cache card 51 occupies space below the microprocessor heat sink 25 and is suspended parallel to the motherboard 22 just above the motherboard 22. An elastomer or other suitable member 52 can be inserted between the L3 cache card 51 and the motherboard 22 as shown, for mechanical support, heat conduction, and electrical insulation. In addition, an elastomer or other suitable member 53 can also be inserted between the L3 cache card 51 and the microprocessor heat sink 25, so that the L3 cache can share the same thermal solution as the microprocessor. In such an embodiment, the elastomer should have high thermal conductivity and good electrical insulation.

Note that while the invention has been described in terms of a socket that accommodates L3 cache and a microprocessor package, the socket design of the present invention may alternatively be used to accommodate types of electronic devices other than L3 cache or microprocessors, if desired.

Thus, a socket which accommodates multiple microelectronic devices has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are

What is claimed is:

1. A socket comprising:
   a socket body having a first surface, a second surface, and a third surface;
   a first electrical interface on the first surface, to electrically couple a microelectronic device to the socket;
   a slot in the second surface-to enable a circuit card to be inserted into the socket body, the slot containing a second electrical interface to electrically couple the circuit card to the socket; and
   a third electrical interface in the third surface at which to couple the socket to a circuit board.

2. A socket as recited in claim 1, further comprising an electrical connection between the first electrical interface and the second electrical interface.

3. A socket comprising:
   a socket body having a first surface at which to mount the socket to a circuit board; a second surface parallel to the first surface; a third surface perpendicular to the first surface and the second surface; and a fourth surface parallel to the third surface;
   an electrical interface on the second surface, at which to couple a package containing a microprocessor to the socket;
   a slot in the third surface, the slot including an electrical interface at which to removably insert a first circuit card having cache memory for use by the microprocessor edgewise into the socket body, to electrically couple the cache memory to the microprocessor; and
   a slot in the fourth surface, the slot in the fourth surface including an electrical interface at which to removably insert a second circuit card having cache memory for use by the microprocessor edgewise into the socket body, parallel to the first circuit board, to electrically couple the cache memory to the microprocessor.

4. A socket as recited in claim 3, wherein the first circuit card is disposed parallel to the first circuit board when the first circuit card is inserted into the first slot.

5. A socket comprising:
   a socket body having a first surface at which to mount the socket to a first circuit board; a second surface parallel to the first surface; and, a third surface and a fourth surface, each perpendicular to the first surface and the second surface;
   a first electrical interface on the second surface, at which to couple a package containing a microelectronic device to the socket;
   a slot in the third surface, including an electrical interface at which to removably insert a first circuit card into the socket body parallel to the first circuit board, the first circuit card having memory for use by the microelectronic device; and
   a slot in the fourth surface, including an electrical interface at which to removably insert a second circuit card into the socket body parallel to the first circuit board, the second circuit card having memory for use by the microelectronic device.

6. A socket as recited in claim 5, further comprising a first member coupled between the first circuit card and the circuit board.

7. A socket as recited in claim 6, wherein the first member comprises a thermal interface to conduct heat away from the first circuit card.

8. A socket as recited in claim 6, further comprising:
   a heat sink coupled to the package; and
   a second member coupled between the first circuit card and the heat sink.

9. An apparatus comprising:
   a package including a microelectronic device;
   a circuit board; and
   a socket coupled to the package and to the circuit board, the socket including
      a socket body having a first surface coupled to the circuit board, a second surface parallel to the first surface and coupled to the package, and a third surface not parallel to the first surface, and
      a slot in the third surface, including an electrical interface at which to removably insert a first circuit card into the socket body parallel to the circuit board.

10. An apparatus as recited in claim 9, wherein the microelectronic device is a microprocessor.

11. An apparatus as recited in claim 10, wherein the first circuit card has disposed thereon cache memory for use by the microprocessor.

12. An apparatus as recited in claim 9, wherein the socket body further has a fourth surface, the socket further comprising a slot in the fourth surface, including an electrical interface at which to removably insert a second circuit card into the socket body parallel to the circuit board.

13. An apparatus as recited in claim 12, wherein the second circuit card has disposed thereon memory for use by the microelectronic device.

14. An apparatus as recited in claim 9, further comprising a first member coupled between the first circuit card and the circuit board.

15. An apparatus as recited in claim 14, wherein the first member comprises a thermal interface to conduct heat away from the first circuit card.

16. An apparatus as recited in claim 14, further comprising:

a heat sink coupled to the package; and a second member coupled between the first circuit card and the heat sink.

17. An apparatus as recited in claim 9, further comprising a heat sink coupled to the package, wherein the first circuit card has disposed thereon memory for use by the microelectronic device, and wherein the first circuit card is disposed between the circuit board and the heat sink.

* * * * *

UNITED STATES PATENT AND TRADEMARK OFFICE
CERTIFICATE OF CORRECTION

PATENT NO. : 6,890,217 B2
DATED : May 10, 2005
INVENTOR(S) : Chiu

It is certified that error appears in the above-identified patent and that said Letters Patent is hereby corrected as shown below:

Column 1,
Line 67, after "the" insert -- figures of accompanying drawings, in which like references indicate similar --.

Column 2,
Line 46, after "be", insert -- reduced, which is advantageous for small-footprint (e.g., mobile) applications. This --.

Column 3,
Line 40, after "are", insert -- to be regarded in an illustrative sense rather than a restrictive sense. --.

Signed and Sealed this

Sixteenth Day of August, 2005

JON W. DUDAS
*Director of the United States Patent and Trademark Office*